(12) United States Patent
Katano

(10) Patent No.: US 7,623,058 B2
(45) Date of Patent: Nov. 24, 2009

(54) ELECTROMAGNETIC WAVE ABSORBING PLATE

(75) Inventor: Masaaki Katano, Mie (JP)

(73) Assignee: Central Glass Company, Limited, Ube-shi (JP)

( * ) Notice: Subject to any disclaimer, the term of this patent is extended or adjusted under 35 U.S.C. 154(b) by 0 days.

(21) Appl. No.: 11/792,813

(22) PCT Filed: Dec. 22, 2005

(86) PCT No.: PCT/JP2005/023644

§ 371 (c)(1),
(2), (4) Date: Jun. 12, 2007

(87) PCT Pub. No.: WO2006/070696

PCT Pub. Date: Jul. 6, 2006

(65) Prior Publication Data

US 2007/0296624 A1  Dec. 27, 2007

(30) Foreign Application Priority Data

Dec. 28, 2004  (JP)  ............................ 2004-378869

(51) Int. Cl.
*H01Q 17/00* (2006.01)
*H05K 9/00* (2006.01)
*H01P 1/22* (2006.01)
*G01S 13/00* (2006.01)

(52) U.S. Cl. ................... 342/4; 342/1; 342/175

(58) Field of Classification Search ........... 342/1–4, 342/175; 174/32, 350, 377, 381–394; 252/62.51 R, 252/62.56, 62.62

See application file for complete search history.

(56) References Cited

U.S. PATENT DOCUMENTS

| 3,309,704 | A  | * | 3/1967  | Klingler ..................... 342/3 |
| 3,737,903 | A  | * | 6/1973  | Suetake et al. ............... 342/1 |
| 6,670,546 | B2 | * | 12/2003 | Okayama et al. ............. 174/391 |
| 7,101,488 | B2 | * | 9/2006  | Kobayashi et al. .......... 252/62.62 |
| 7,108,799 | B2 | * | 9/2006  | Kobayashi et al. .......... 252/62.62 |
| 2004/0183711 | A1 | * | 9/2004 | Kobayashi et al. ............. 342/1 |

FOREIGN PATENT DOCUMENTS

| JP | 61-269892 A | 11/1986 |
| JP | 9-255408 A  | 9/1997  |
| JP | 10-13083    | 1/1998  |
| JP | 10-275998 A | 10/1998 |
| JP | 2001-44750 A | 2/2001  |
| JP | 2002-121842 A | 4/2002 |

(Continued)

OTHER PUBLICATIONS

"Ferrite Tile Absorbers for EMC Test Chamber Applications"; no author given; no date given; 14th edition; Fair-Rite Products Corp.; Wallkill, New York.*

(Continued)

*Primary Examiner*—Bernarr E Gregory
(74) *Attorney, Agent, or Firm*—Crowell & Moring LLP

(57) ABSTRACT

An electromagnetic wave absorbing plate composed of a transparent plate-like dielectric, wherein a thickness of the dielectric is determined such that an electromagnetic wave absorption quantity determined by using an incident side impedance $Z_{xi}$ at a time at which the electromagnetic wave becomes incident on a surface of the dielectric is equal to or higher than 10 dB.

3 Claims, 5 Drawing Sheets

FOREIGN PATENT DOCUMENTS

| | | | |
|---|---|---|---|
| JP | 2002-185180 A | 6/2002 |
| JP | 3318490 B2 | 6/2002 |
| JP | 2002-314285 A | 10/2002 |
| JP | 2003-8279 A | 1/2003 |
| JP | 2003-60383 A | 2/2003 |
| JP | 2003-115694 A | 4/2003 |
| JP | 2003-133784 A | 5/2003 |
| JP | 2003-289220 A | 10/2003 |
| JP | 2004-179354 A | 6/2004 |
| KR | 2000-0064579 A | 11/2000 |
| KR | 10-2004-0056576 A | 7/2004 |
| KR | 10-2004-0089283 A | 10/2004 |
| WO | WO 98/31072 A1 | 7/1998 |
| WO | WO 2004/091049 A1 | 10/2004 |

OTHER PUBLICATIONS

International Search Report dated Jan. 24, 2006 including English translation (Five (5) pages).

Korean Office Action dated Jun. 5, 2008 (Three (3) pages).

Syu Hashimoto, Chapter 2, Narrow Band Electric Wave Absorbing Wave, Chapter 3 Ferromagnetic Body Resonance System, Technique and Application of Electric Wave Absorbing Body, pp. 17-25 and 92-98, No. 6 (Nineteen (19) pages).

Yoshiyuki Naito, Plane Electromagnetic Wave and Voltage and Current on Distributed Constant Circuits, Ohm Shu, pp. 42-51 and 100-105, No. 7 (Eighteen (18) pages).

Japanese Office Action dated Jun. 12, 2007 (Four (4) pages).

Japanese Office Action dated Mar. 31, 2009 (three (3) pages).

* cited by examiner

ELECTROMAGNETIC WAVE ABSORBING PLATE

TECHNICAL FIELD

The present invention relates to a transparent electromagnetic wave absorbing plate to be mainly used for an opening of an external wall of a building, an indoor partition between rooms, or so forth.

BACKGROUND OF THE INVENTION

Recently, along with a rapid progress of an information transmission technology, various information transmissions become possible. From among these information transmissions, a wireless information transmission is very superior and is widely utilized from a standpoint of its usability.

Means for transmitting information through the wireless transmission includes various electronic equipments such as a cellular phone, PDA (Personal Digital Assistance), a wireless LAN (Local Area Network), a broadcasting wave, an automotive vehicular radar, ETC (Electronic Toll Connection System) mounted device, and so forth.

On the other hand, along with a popularization of the wireless information transmission, an electromagnetic wave emitted from the equipment used in the wireless information transmission is invaded into a building from an opening formed on the building to serve as an electromagnetic noise for the other pieces of equipment. Hence, an electromagnetic wave absorbing plate having a transparency and which can effectively absorb the electromagnetic wave becomes demanded.

A wireless LAN (Local Area Network), from among the wireless information transmissions, requires no LAN construction in the indoor (cable wiring construction and so forth). Hence, the wireless LAN contributes largely on a cost reduction and on easiness in handling in an office and in a general home.

However, the wireless LAN gives many problems such as a reduction in a LAN speed due to an influence of a reflective plate (desk, rocker, chair, and so forth) in the case of an indoor use, a tap due to an electric wave leakage toward an outdoor, an ill effect due to an electric wave interference (due to four channels in 2.45 GHz range) in the building or between buildings, and generations of external unauthorized access, spoofing, and so forth. As a countermeasure of such problems as described above, such a countermeasure as an exchange of issurer certificates between communication terminals such as PC and a server, a data encryption, or a regular automatic modification of an encrypt key, an ID, and a password involves a high possibility of a third person's decipher.

Therefore, a transparent electromagnetic wave absorbing plate is required to be attached onto an indoor room partition and an opening on the building or between buildings. Furthermore, in an ETC lane such as a toll gate in an express way, in order to prevent an erroneous operation due to a reflective wave from a vehicle on a general traffic lane, the transparent electromagnetic wave absorbing plate is required as a partitioning wall between an ETC lane and a general traffic lane and as a partitioning wall between mutual ETC lanes.

It is generally known that, as the electromagnetic wave absorbing plate which absorbs the electromagnetic wave, for example, two layers of laminated ITO (Indium-Tin Oxide) conductive films laminated in a transparent film, one layer being used for an electromagnetic wave absorbing material and the other layer being used for an electromagnetic wave reflecting material, and an interval between the two layers can be adjusted to be ¼ wavelength of the electromagnetic wave to be absorbed (refer to a Patent Literature 1).

An electromagnetic wave absorbing material in which the interval between the electromagnetic wave absorbing material and the electromagnetic wave reflecting material is ¼ the absorption frequency has resulted in a thickness in a range from 10 cm to 1 m or thicker, in a case where a frequency band to be absorbed by this electromagnetic wave absorbing substance is a VHF band. In order to thin this thickness range, another type of electromagnetic wave absorbing plate has been proposed in which an insulating substrate on which conductive coatings are formed in stripe shapes or in lattice shapes is interposed between the electromagnetic wave absorbing plate and electromagnetic wave reflecting plate to increase an effective permeability between the electromagnetic wave absorbing material and the electric wave reflecting material (refer to a Patent Literature 2).

Furthermore, a technique to obtain an electromagnetic wave absorbing effect utilizing a phase difference between the electromagnetic wave reflected on a surface of an impedance layer and the electromagnetic wave reflected on a surface of a dielectric layer has been disclosed (refer to a Patent Literature 3).

Patent Literature 1: Japanese Patent Application Publication (Tokkai) No. 2001-44750;

Patent Literature 2: Japanese Patent Application Publication (Tokkai) No. Heisei 10-275998; and Patent Literature 3: Japanese Patent Application Publication (Tokkai) No. 2003-8279.

In a case where the electromagnetic wave absorbing material in which the interval of distance between the electromagnetic wave absorbing material and the electromagnetic wave reflecting material is ¼ the wavelength of the electromagnetic wave to be absorbed, a thickness of the electromagnetic wave absorbing material requires ¼ the wavelength of the electromagnetic wave to be absorbed and indicates about 31 mm.

In order to attach this electromagnetic wave absorbing material to the partition of a room and a floor passage or of a window of a building, such a problem that the thickness of the material itself is too thick. In addition, the other type of electromagnetic wave absorbing material in which the insulating material on which conductive coatings are formed in the strip shapes or in the lattice shapes is arranged, the thickness of the electromagnetic wave absorbing plate can be decreased. However, its structure is complex and a mass production is difficult. Furthermore, in a case where the impedance layer is installed only at one side of the transparent electromagnetic wave material, the electromagnetic waves cannot be bi-directionally absorbed.

SUMMARY OF THE INVENTION

It is, in view of the above-described circumstances, an object of the present invention to provide a transparent electromagnetic wave absorbing plate which is capable of sufficiently absorbing the electromagnetic waves in a frequency range from 1 through 10 GHz used in the cellular phone, in the wireless LAN, or in the ETC bi-directionally.

In the electromagnetic wave absorbing plate according to the invention, an electromagnetic wave absorbing plate is composed of a transparent plate-like dielectric, wherein a thickness of the dielectric is determined for an electromagnetic wave absorption quantity Ai determined by an equation (2) to be equal to or higher than 10 dB using an incident side impedance Zxi determined by an equation (1) when the electromagnetic wave becomes incident on a surface of the dielectric.

[Equation 1]

$$Zxi = \sqrt{\frac{\mu}{\varepsilon}} \times \tanh\left[\left(2j \times \frac{\pi}{\lambda_i} \times \sqrt{\varepsilon \times \mu} \times d\right) + a\tanh\left(\frac{\frac{Zr}{377}}{\sqrt{\frac{\mu}{\varepsilon}}}\right)\right] \quad (1)$$

In equation (1), $\in$ denotes a complex permittivity of a transparent plate-like substance, µ denotes a relative permittivity of the transparent plate-like substance, λi denotes a wavelength of the electromagnetic wave, d denotes a thickness of the dielectric (m: meter), and Zr denotes an input impedance of the dielectric side.

[Equation 2]

$$A_i = 20 \times \log(|\Gamma_i|) \quad (2)$$

In equation (2), $\Gamma_i$ denotes a reflection coefficient of the electromagnetic wave of the surface of the dielectric and determined by (Zxi−1)/Zxi+1).

The electromagnetic wave absorbing plate according to the present invention can provide a simple structure transparent electromagnetic wave absorbing plate which effectively functions in a frequency range of 1 through 10 GHz and is especially effective for frequencies of 2.45 GHz and 5.2 GHz of the wireless LAN and for 5.8 GHz of the ETC.

DETAILED DESCRIPTION

Frequencies at which an electromagnetic wave absorbing plate according to the present invention becomes effective are approximately from 1 GHz to 10 GHz. These frequencies include 800 MHz through 1 GHz and 1.5 GHz band of a cellular phone, 1.9 GHz band of PHS (Personal Handyphone System), 2.45 GHz band of PDA (Personal Digital Assistance), and 2.45 GHz band and 5.2 GHz band used in the wireless LAN of PC, 5.8 GHz band of ETC vehicle mounted equipment, and so forth.

Figure 1:
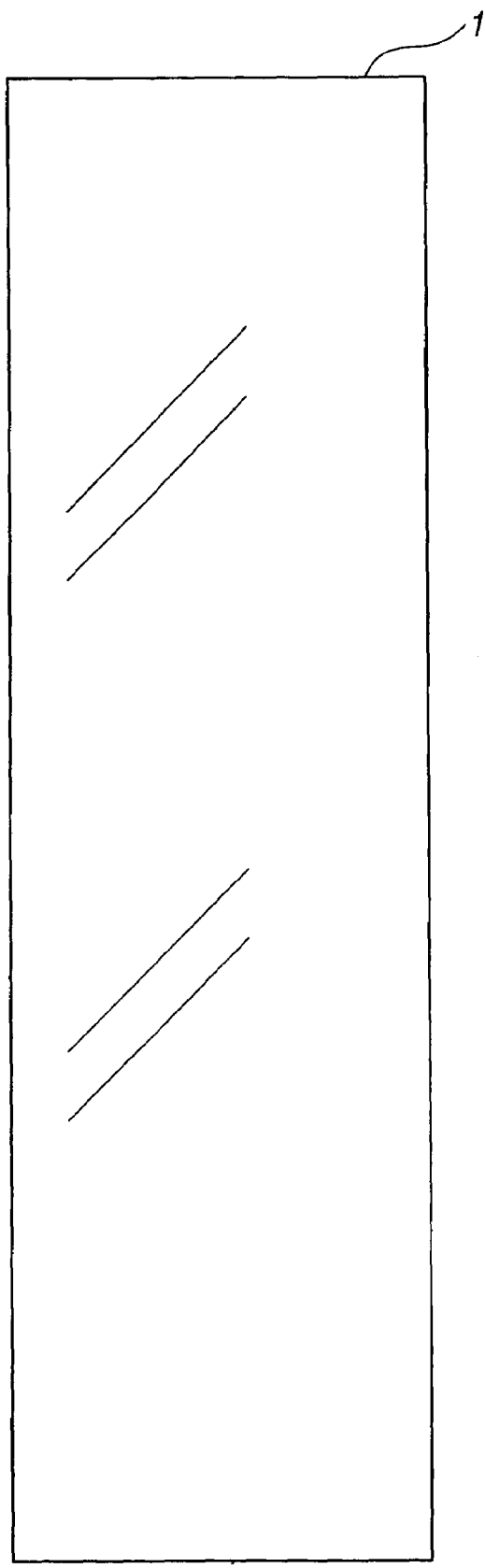
FIG. 1 is a cross sectional view of an electromagnetic wave absorbing plate using a single sheet glass according to the present invention.
Figure 2:
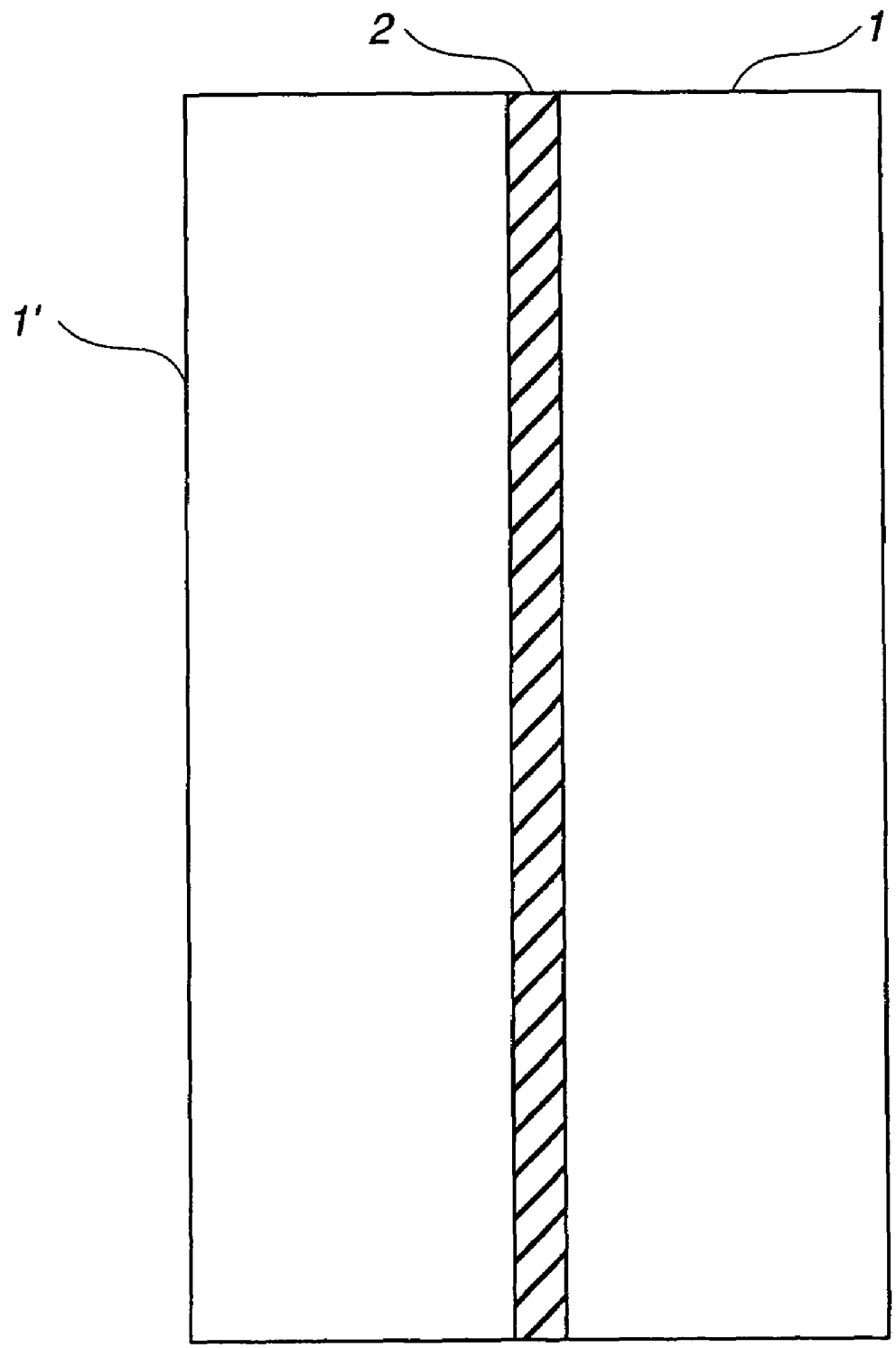
FIG. 2 is a cross sectional view of the electromagnetic wave absorbing plate using a laminated safety glass.

The electromagnetic wave absorbing plate according to the present invention is formed of a transparent plate-like dielectric, as shown in FIGS. 1 and 2. The transparent plate-like dielectric is either one sheet of transparent dielectric 1 or a transparent plate in which two or more sheets of transparent dielectrics are laminated via an interlayer or interlayers. FIG. 2 shows a transparent plate in which two sheets of the dielectric are laminated via the interlayer. In FIG. 2, two sheets of dielectrics 1 and 1' are laminated with interlayer 2.

For the transparent dielectric, one of various kinds of sheet glasses such as a soda-lime series glass, an aluminosilicate series glass, a boro-silicate series glass, and so forth or one of various kinds of plastic plates such as a polycarbonate plate or an acrylic plate can be used.

The two or more sheets of dielectric can be laminated using the interlayer or interlayers such as polyvinyl butyral, EVA (Ethylene-vinyl acetate copolymer), or so forth. The same kinds of dielectric may be laminated. However, both of plate glass and plastic plate may be laminated.

Figure 3:
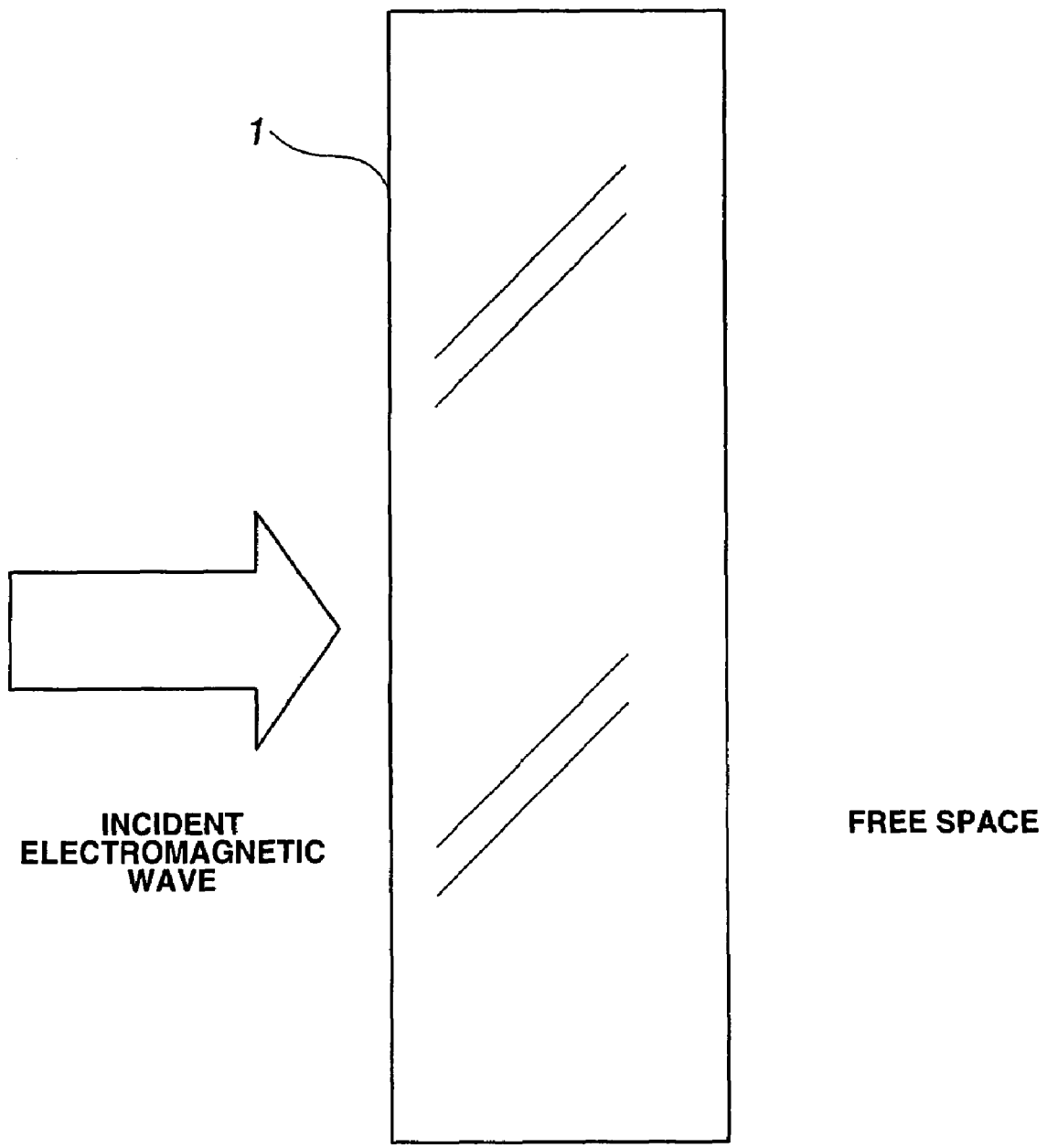
FIG. 3 is a conceptual view for calculating an electromagnetic wave arrival direction and an electromagnetic wave absorption quantity which are to be absorbed by the electromagnetic wave absorbing plate according to the present invention.

An electromagnetic wave absorption performance of the electromagnetic wave absorbing plate according to the present invention is determined in the following way. FIG. 3 shows an explanatory view for explaining a method of determining an impedance of the electromagnetic wave absorbing plate in the following way.

Figure 4:
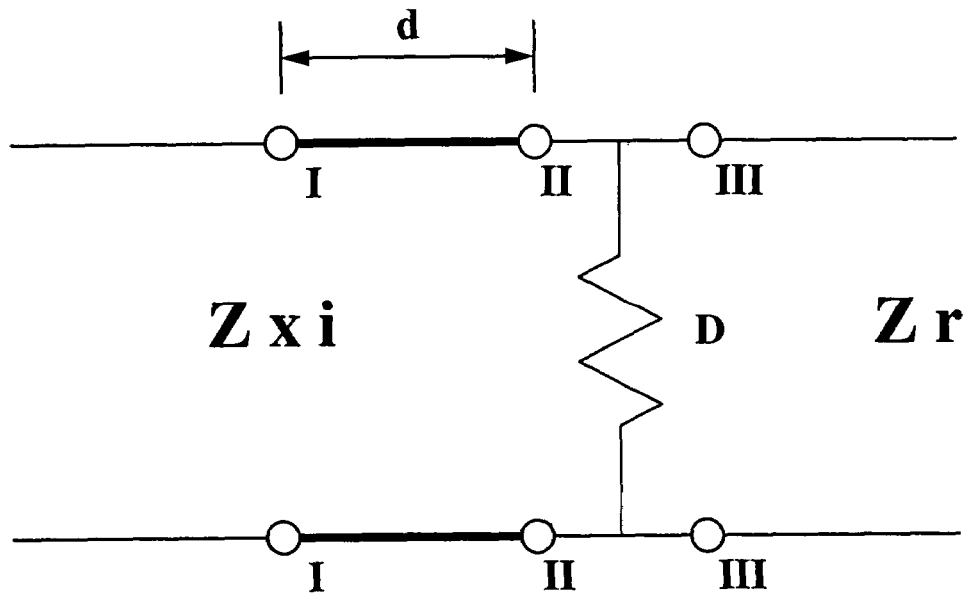
FIG. 4 is an equivalent circuit diagram to calculate an impedance of the dielectric.

The impedance (a sheet resistance:Ω/□) Zr of the transparent dielectric in FIG. 3 is determined through the following equation from an equivalent circuit thereof shown in FIG. 4.

[Equation 3]

$$Zr = \frac{D \times 377}{D + 377} \quad (3)$$

In equation (3), D in equation (3) denotes a sheet resistance (Ω/□) of the dielectric and 377 denotes an aerial characteristic impedance.

An input impedance Zxi of the electromagnetic wave at a side of the dielectric on which the electromagnetic wave is incident is a value determined by the following equation (1) from the equivalent circuit shown in FIG. 4.

[Equation 4]

$$Zxi = \sqrt{\frac{\mu}{\varepsilon}} \times \tanh\left[\left(2j \times \frac{\pi}{\lambda_i} \times \sqrt{\varepsilon \times \mu} \times d\right) + a\tanh\left(\frac{\frac{Zr}{377}}{\sqrt{\frac{\mu}{\varepsilon}}}\right)\right] \quad (1)$$

In equation (1), $\in$ denotes a complex permittivity of the transparent plate-like body, µ denotes a relative permittivity of the transparent plate-like body, $\lambda_i$ denotes a wavelength of the electromagnetic wave, d denotes a thickness of the dielectric (m; meters), and Zr denotes an input impedance of the dielectric side. In the case of the plate glass, E=7−0.1j(j= $-1^{1/2}$) and µ=1. $\lambda_i$ denotes a wavelength of the electromagnetic wave and d denotes a thickness (m) of the transparent plate-like body.

Furthermore, a reflection coefficient Γi of the electromagnetic wave reflected on the surface of the transparent plate-like dielectric is a value derived from the following equation (4).

[Equation 5]

$$\Gamma_i = \frac{Zxi - 1}{Zxi + 1} \quad (4)$$

Absorption quantity Ai can be determined through the following equation (2) from reflection coefficient $\Gamma_i$.

[Equation 6]

$$A_i = 20 \times \log(|\Gamma_i|) \quad (2)$$

It is noted that, in the case of the glass plate, the complex permittivity and the relative permeability are $\in = 7 - 0.1j (j = -1^{1/2})$ and $\mu = 1$, respectively.

If the absorption performance of the electromagnetic wave is equal to or lager than 10 dB (an electromagnetic wave energy is attenuated by 1/10), it indicates a sufficient performance for the electromagnetic wave having a weak output electromagnetic wave such as a cellular phone, indoor LAN, or ETC and can effectively be used as the electromagnetic wave absorbing plate.

In a case where the dielectric is the plate glass, the absorption performance for the frequency range from 1 to 10 GHz is as shown in Tables 1 through 4. In order to provide the electromagnetic wave absorption performance equal to or higher than 10 dB, the thickness of the plate glass is desirably 9 mm or thicker. In order to practically use the plate glass onto the opening such as a window, it is desirable to have the thickness of equal to or thinner than 25 mm.

In a case where the glass plate was used for the dielectric, the sheet resistance of the glass was $10^{14} \Omega/\square$ and the absorption quantity of the electromagnetic wave was calculated.

Table 1 shows a thickness of the plate glass (or sheet glass) having an absorption performance of 10 dB or higher for 2.45 GHz of the frequency of the wireless LAN.

TABLE 1

| Electromagnetic wave absorption performance dB | Plate glass thickness mm |
| --- | --- |
| 10 dB or higher | 21.0~25.5 |
| 20 dB or higher | 22.3~24.0 |

According to Table 1, the thickness of the plate glass is preferably in a range from 21 through 25.5 mm for the 2.45 GHz frequency of the wireless LAN.

Furthermore, if the thickness of the plate glass is preferably in a range from 22.3~24.0 mm to obtain the absorption performance of 20 dB or higher.

Table 2 shows the thickness of the plate glass whose absorption performance indicates 10 dB or more for 5.2 GHz of the frequency of the wireless LAN.

TABLE 2

| Electromagnetic wave absorption performance dB | Plate glass thickness mm |
| --- | --- |
| 10 dB or higher | 10.0~12.0 |
| 20 dB or higher | 10.6~11.3 |

According to Table 2, the thickness of the plate glass desirably falls in a range from 10 through 12 mm for 5.2 GHz frequency of the wireless LAN.

Furthermore, the absorption performance equal to or higher than 20 dB is preferably obtained when the thickness of the plate glass ranges from 10.6 through 11.3 mm. In addition, even if a front surface of the above-described plate glass was reversed to a rear surface thereof, the performance value was the same result shown in Table 2. In other words, it was confirmed that the electromagnetic wave absorption performance was provided in a bi-direction.

Figure 5:
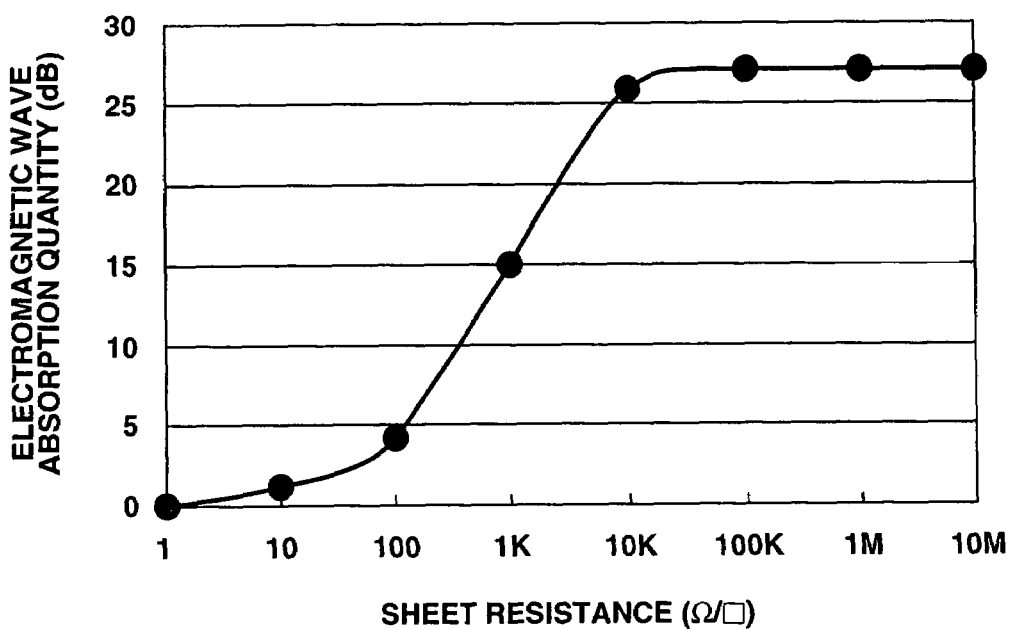
FIG. 5 is a graph representing a relationship between a sheet resistance of the dielectric and the electromagnetic wave absorption quantity of an electromagnetic wave having a frequency of 5.2 GHz, in a case where the thickness of the laminated safety glass is 11 mm.

FIG. 5 shows the electromagnetic wave absorption performance determined from equation (3) for the electromagnetic wave having the frequency of 5.2 GHz when a sheet resistance of the surface of the dielectric having a thickness of 11 mm is varied. It was indicated from FIG. 5 that the absorption quantity of the electromagnetic wave was not varied with a maximum value maintained when the sheet resistance of the dielectric is equal to or higher than $10^5 \Omega/\square$ (100 KΩ/□). Hence, if the thickness of the dielectric is 11 mm, the sheet resistance of the dielectric is desirably equal to or higher than $10^5 \Omega/\square$ (100 KΩ/□).

Figure 6:
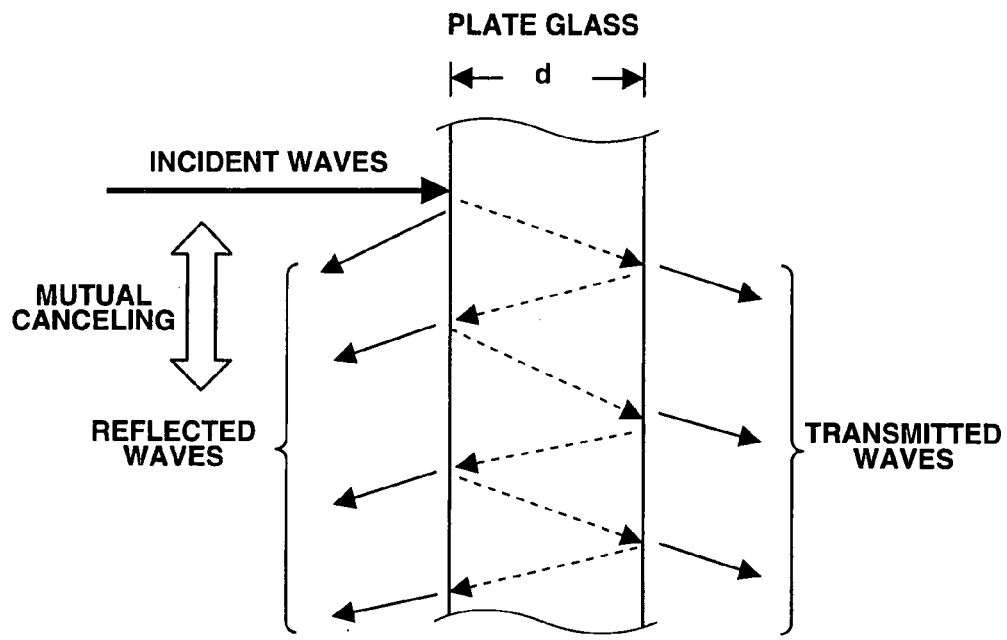
FIG. 6 is a graph representing an effect of mutually canceling incident waves and reflected waves (a phase difference effect).

FIG. 6 shows an revelation of the absorption performance due to a canceling effect (a phase difference effect) of incident and reflected waves which corresponds to λ/4 at 5.2 GHz frequency foe the glass plate thickness of 11 mm according to the result in FIG. 5 and the calculation result of equation (2).

Table 3 shows the thickness of plate glass equal to or higher than 10 dB of the absorption performance for 5.8 GHz of the ETC.

TABLE 3

| Electromagnetic wave absorption performance dB | Plate glass thickness mm |
| --- | --- |
| 10 dB or higher | 9.0~11.0, 18.5~20.6 |
| 20 dB or higher | 9.5~10.1 |

According to Table 3, for the frequency of 5.8 GHz frequency of ETC, the thickness of the plate glass may range from 9 through 11 mm and 18.5 through 20.6 mm.

Furthermore, the thickness of the plate glass preferably ranges from 9.5 through 10.1 mm to obtain the absorption performance of 20 dB or higher.

Table 4 shows the thickness of the plate glass of a simultaneous absorption type of 2.4 GHz and 5.2 GHz in a frequency band of the wireless LAN range.

TABLE 4

| Electromagnetic wave absorption performance dB | Plate glass thickness mm |
| --- | --- |
| 10 dB or higher | 21.0~23.0 |

According to Table 4, the thickness of the plate glass preferably ranges from 21.0 through 23.0 mm for the frequencies of the simultaneous absorption type.

Embodiment 1

The electromagnetic wave absorbing plate according to the present invention will be described in details with reference to the drawings.

The electromagnetic wave absorbing plates having different thicknesses of dielectrics as shown in FIG. 1 or FIG. 2 using the single-sheet plate glass or two or more sheets of plate glasses adhered to PVB (Polyvinyl Butyral) film were prepared.

Figure 7:
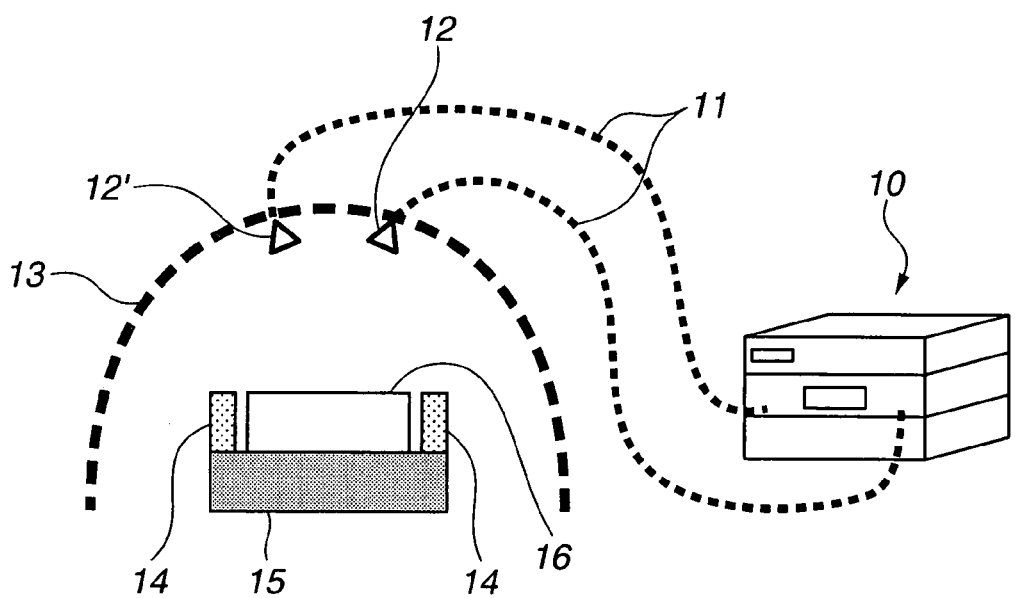
FIG. 7 is a graph representing a measurement instrument for an electromagnetic wave absorption performance.

The absorption performance of the electric wave absorbing plate thus prepared was measured with an arch type measuring instrument shown in FIG. 7.

The measurement was made in which the electromagnetic wave was transmitted from a transmitting antenna 12 installed within an arch-type frame 13 using a network analyzer 10 and a reflection quantity of the electromagnetic wave reflected on electromagnetic wave absorbing plate or on a metallic plate not shown was measured through a receiving antenna 12' by the network analyzer. Phone antennae were used for both of the transmitting antenna and the receiving antenna.

For the electromagnetic wave absorbing plate, the reflection quantity of the glass surface was measured, the reflection quantity of a metallic plate prepared by aluminum was measured, and, then, the reflection quantity of the electromagnetic wave absorbing plate was measured. Then, a difference between those reflection quantities of the metallic plate and the electromagnetic wave absorbing plate was calculated as the electromagnetic wave absorption quantity of an electromagnetic wave shield plate.

It should be noted that the measurement of the reflection quantity of the electromagnetic wave shield plate was that the reflection quantity from a glass surface was measured, in order to relieve an effect of the reflection from the floor or other surfaces, a specimen mount 15 made of a foam polyurethane having an electromagnetic absorption characteristic was rested on the metallic plate not shown and the electromagnetic wave absorbing plate to be measured was lied on specimen mount 15. In addition, the measurement for the electromagnetic wave absorbing plate was made, with well-known electromagnetic wave absorbing bodies 14 surrounded.

Specimens 1 through 4 shown in Table 5 are the electromagnetic wave absorbing plates prepared for the use of a frequency band of 2.45 GHz of the wireless LAN. The thicknesses of dielectric 14 were selected from 21.0 mm, 22.5 mm, and 25.5 mm to prepare the electromagnetic wave absorbing plates and, furthermore, in a frequency band of 2.45 GHz, the electromagnetic wave absorbing plate was prepared having the thickness of the dielectric of 23.5 mm which provides the maximum absorption quantity at 2.45 GHz frequency band.

For the electromagnetic wave absorbing plates for the respective specimens 1 through 4, the electromagnetic wave absorption quantities for the electromagnetic wave having the frequency of 2.45 GHz using the measurement instrument shown in FIG. 7 were measured.

The electromagnetic wave absorption quantities determined according to the calculated values and those measured values were made coincident with each other as shown in Table 5. Furthermore, even in a case where the surfaces of the electromagnetic wave absorbing plate glass of specimens 1 through 4 were reversed in both sides, the performance values result in the same values as shown in Table 5. In other words, it was confirmed that the bi-directional electromagnetic wave absorbing performances were present.

TABLE 5

|  | Specimen 1 | Specimen 2 | Specimen 3 | Specimen 4 |
| --- | --- | --- | --- | --- |
| Thickness of dielectric body (mm) | 21.0 | 22.5 | 25.5 | 23.5 |

TABLE 5-continued

|  | Specimen 1 | Specimen 2 | Specimen 3 | Specimen 4 |
| --- | --- | --- | --- | --- |
| Electromagnetic wave absorption quantity (calculated value dB) | 10 | 20 | 10 | 25 |
| Electromagnetic wave absorption quantity (measured value dB) | 10 | 20 | 10 | 25 |

It should be noted that the measurements were made for a TE (Transversal Electric) wave (in a case where an electric field is vertical with respect to an incident surface) and a TM (Transversal Magnetic) wave (in a case where a magnetic field is vertical with respect to the incident surface). However, these measurements had no remarkable differences.

Boxes using the electromagnetic wave shield plates of specimens 1 through 4 were prepared and a notebook model personal computer was installed within each of the boxes having specimens 1 through 4. Although the wireless LAN connection was tried from the notebook model personal computer to a server external to each of the boxes, the wireless LAN connection could not be achieved. Thus, it was confirmed that the electromagnetic wave absorbing plates of specimens 1 through 4 provide electromagnetic wave absorption performances at practical levels.

In addition, specimens 5 through 7 shown in Table 6 are electromagnetic wave absorbing plates prepared to be used in 5.2 GHz frequency band of the wireless LAN. The thicknesses 10.0 mm and 12.0 mm of the dielectrics were selected from Table 2. In addition, the electromagnetic wave absorbing plates having the maximum absorbing quantity of the electromagnetic waves at 5.2 GHz frequency band were prepared. For specimens 5 through 7, the calculated electromagnetic wave absorption quantity and the measured electromagnetic wave absorption quantity were sufficiently made coincident with each other, as shown in Table 6. Furthermore, in a case where the plate glass is reversed in both sides, the performance values resulted in the same values as shown in Table 6. In other words, it was confirmed that the bi-directional electromagnetic wave absorption performances were present.

TABLE 6

|  | Specimen 5 | Specimen 6 | Specimen 7 |
| --- | --- | --- | --- |
| Thickness of dielectric (mm) | 12.0 | 10.0 | 11.0 |
| Electromagnetic wave absorption quantity (calculated value dB) | 10 | 10 | 27 |
| Electromagnetic Wave absorption Quantity (measured Value dB) | 10 | 10 | 27 |

Specimens 8 through 11 shown in Table 7 were the electromagnetic wave absorbing plates prepared for the use in 5.8 GHz frequency band of the ETC. The thicknesses 9.0 mm, 9.5 mm, 11.0 mm, and 20.5 mm of the dielectrics were selected from Table 3. For specimens 8 through 11, the calculated values and measured values were sufficiently made coincident with each other, as shown in Table 7. Furthermore, even if the surfaces of specimens 8 through 11 are reversed, the performance values resulted in the same values shown in Table 7. In other words, it was confirmed that the bi-directional electromagnetic wave absorption performances were present.

TABLE 7

|  | Specimen 8 | Specimen 9 | Specimen 10 | Specimen 11 |
|---|---|---|---|---|
| Thickness of dielectric (mm) | 9.0 | 9.5 | 11.0 | 20.5 |
| Electromagnetic wave absorption quantity (calculated value dB) | 10 | 20 | 10 | 10 |
| Electromagnetic Wave absorption quantity (measured value dB) | 10 | 20 | 10 | 10 |

In addition, specimen 12 shown in Table 8 is the plate glass having the absorption performance shown in Table 3 is 20 dB or more for the frequency 5.8 GHz of the ETC. In addition, specimen 13 is an electromagnetic wave absorbing plate having the absorption quantity exceeding 20 dB and the electromagnetic wave absorbing plate having the thickness of 9.63 mm which was thinner than specimen 12 by 0.07 mm was prepared. Specimen 12 made a plate thickness adjustment with 4 mm thick plate glass and 5 mm thick plate glass laminated with PVB (Polyvinyl Butyral) film. Then, specimen 13 made a plate thickness adjustment for 10 mm plate glass through a touch polish grinding to have the thickness of 9.63 mm.

TABLE 8

|  |  | Specimen 12 | | Specimen 13 | |
|---|---|---|---|---|---|
| Thickness of dielectric (mm) | | 9.70 mm | | 9.63 mm | |
| Electromagnetic wave absorption quantity (calculated value dB) | | 27 dB | | 24 dB | |
| Electromagnetic wave absorption quantity (measured value dB) | | Front surface | Rear surface | Front Surface | Rear surface |
| measurement angle | 4 degrees | 26 dB | 26 dB | 23 dB | 23 dB |
|  | 20 degrees | 26 | 26 | 21 | 21 |
|  | 45 degrees | 17 | 17 | 17 | 17 |
|  | 55 degrees | 15 | 15 | 15 | 15 |

As shown in Table 8, even if a difference in thickness equal to or shorter than 1 mm occurred, the absorption performance was varied. However, it was confirmed that, according to the present invention, a minute adjustment in thickness for the absorption performance of the electromagnetic waves became possible.

The invention claimed is:

1. An electromagnetic wave absorbing plate composed of a transparent plate-like dielectric, wherein a thickness of the dielectric is determined for an electromagnetic wave absorption quantity $A_i$ determined by the following equation (2) to be equal to or greater than 10 dB using an incident side impedance $Z_{xi}$ determined by the following equation (1) at a time at which the electromagnetic wave becomes incident on a surface of the dielectric and, in the equation (1), $\in$ denotes a complex dielectric permittivity of the transparent plate-like dielectric, $\mu$ denotes a relative permittivity of the transparent plate-like dielectric, $\lambda_i$ denotes a wavelength of the electromagnetic wave, and d denotes the thickness of the transparent plate-like dielectric in meters, and Zr denotes an input impedance of the dielectric side and, in the equation (2), $\Gamma_i$ denotes a reflection coefficient of the electromagnetic wave of the surface of the dielectric and determined by $(Z_{xi}-1)/(Z_{xi}+1)$, $$Zxi = \sqrt{\frac{\mu}{\varepsilon}} \times \tanh\left[\left(2j \times \frac{\pi}{\lambda_i} \times \sqrt{\varepsilon \times \mu} \times d\right) + a\tanh\left(\frac{\frac{Zr}{377}}{\sqrt{\frac{\mu}{\varepsilon}}}\right)\right] \quad (1)$$

$$A_i = 20 \times \log(|\Gamma_i|). \quad (2)$$

2. The electromagnetic wave absorbing plate as claimed in claim 1, wherein a sheet resistance of the dielectric is equal to or higher than $10^5 \Omega/\square$.

3. The electromagnetic wave absorbing plate as claimed in claim 1, wherein the dielectric is made of two or more sheets of plate glass laminated via an interlayer and has a thickness ranging from 9.0 through 25.5 mm.

* * * * *